(12) United States Patent
Kawaguchi et al.

(10) Patent No.: US 12,733,111 B2
(45) Date of Patent: Sep. 8, 2026

(54) PRINTED WIRING BOARD MANUFACTURING METHOD AND PROCESSING SYSTEM

(71) Applicant: IBIDEN CO., LTD., Ogaki (JP)

(72) Inventors: Katsuo Kawaguchi, Ogaki (JP); Tsutomu Yamauchi, Ogaki (JP); Takeshi Takagi, Ogaki (JP); Takuya Otsuki, Ogaki (JP); Masanori Sano, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 828 days.

(21) Appl. No.: 18/052,598

(22) Filed: Nov. 4, 2022

(65) Prior Publication Data

US 2023/0145560 A1 May 11, 2023

(30) Foreign Application Priority Data

Nov. 5, 2021 (JP) ................................ 2021-180826

(51) Int. Cl.
*H05K 3/46* (2006.01)

(52) U.S. Cl.
CPC ......... *H05K 3/4644* (2013.01); *H05K 3/4602* (2013.01)

(58) Field of Classification Search
CPC .. H05K 3/4644; H05K 3/4602; H05K 3/0035; H05K 3/0005; H05K 1/0265;
(Continued)

(56) References Cited

U.S. PATENT DOCUMENTS 4,789,770 A * 12/1988 Kasner ............... B23K 26/0613 219/121.75
5,633,735 A * 5/1997 Hunter, Jr. ........... G03H 1/0005 359/9
(Continued)

FOREIGN PATENT DOCUMENTS

CA 2370832 A1 * 11/2000 ......... B23K 26/0643
CA 2624200 A1 * 4/2007 ........... B23K 26/382
(Continued)

OTHER PUBLICATIONS

Translation of JP-2002217551-A (Year: 2002).*
Translation of JP-2004333595-A (Year: 2004).*

*Primary Examiner* — Jeffrey T Carley
(74) *Attorney, Agent, or Firm* — Finnegan, Henderson, Farabow, Garrett & Dunner, LLP

(57) ABSTRACT

A method for manufacturing a printed wiring board includes preparing an intermediate substrate including an insulating layer, a conductor layer including circuits, and a first resin insulating layer, inputting, to a laser processing machine that forms openings, positions of the openings, generating, based on analysis of the conductor layer, classification of the circuits, inputting, to the machine, shot numbers for forming the openings determined based on the classification, and executing the machine based on the positions and shot numbers such that the openings are formed. The circuits include power supply, ground, and signal circuits, the classification includes stratifying such that the power supply and ground circuits belong to the first category and the signal circuits belong to the second category, and the inputting includes setting the shot number for the openings belonging to the first category is smaller than the shot number for the openings belonging to the second category.

17 Claims, 8 Drawing Sheets

(58) Field of Classification Search
CPC .... H05K 1/115; B23K 26/382; B23K 26/082; B23K 2101/42; B23K 2103/172
See application file for complete search history.

(56) References Cited

U.S. PATENT DOCUMENTS

| | | | | |
|---|---|---|---|---|
| 6,614,110 | B1 * | 9/2003 | Pace | H01L 23/49811 257/E23.079 |
| 8,964,801 | B2 * | 2/2015 | Reid | B23K 26/40 372/6 |
| 9,465,477 | B2 * | 10/2016 | Rosenberg | G06F 3/04166 |
| 2005/0087522 | A1 * | 4/2005 | Sun | B23K 26/40 219/121.61 |
| 2007/0272667 | A1 * | 11/2007 | Lei | H05K 3/0035 219/121.71 |
| 2020/0253051 | A1 * | 8/2020 | Tay | H05K 1/186 |
| 2024/0057260 | A1 * | 2/2024 | Richards | H05K 3/08 |

FOREIGN PATENT DOCUMENTS

| | | | | | |
|---|---|---|---|---|---|
| GB | 2337719 | A | * | 12/1999 | B23K 26/0624 |
| JP | 2002-144060 | A | | 5/2002 | |
| JP | 2002217551 | A | * | 8/2002 | |
| JP | 2004333595 | A | * | 11/2004 | |
| WO | WO 98/22252 | A1 | | 5/1998 | |

* cited by examiner

PRINTED WIRING BOARD MANUFACTURING METHOD AND PROCESSING SYSTEM

CROSS-REFERENCE TO RELATED APPLICATIONS

The present application is based upon and claims the benefit of priority to Japanese Patent Application No. 2021-180826, filed Nov. 5, 2021, the entire contents of which are incorporated herein by reference.

BACKGROUND OF THE INVENTION

Field of the Invention

A technology described herein relates to a method for manufacturing a printed wiring board and a processing system used in the manufacturing of the printed wiring board.

Description of Background Art

International Publication No. 98/22252 describes a laser processing device having multiple galvano heads. The entire contents of this publication are incorporated herein by reference.

SUMMARY OF THE INVENTION

According to one aspect of the present invention, a method for manufacturing a printed wiring board includes preparing an intermediate substrate including an insulating layer, a conductor layer including conductor circuits formed on the insulating layer, and a first resin insulating layer formed on the insulating layer and covering the conductor layer, inputting, to a laser processing machine that forms openings for via conductors such that the openings penetrate through the first resin insulating layer and reach the conductor layer, positions at which the openings are to be formed in the intermediate substrate, generating, based on analysis of the conductor layer, classification of the conductor circuits in the conductor layer under the positions at which the openings are to be formed in the intermediate substrate, inputting, to the laser processing machine, shot numbers for forming the openings determined based on the classification of the conductor circuits in the conductor layer, and executing the laser processing machine based on the positions and the shot numbers such that the openings are formed in the intermediate substrate. The conductor circuits in the conductor layer include power supply conductor circuits, ground conductor circuits, and signal conductor circuits, the classification includes stratifying the conductor circuits into a first category and a second category such that the power supply conductor circuits and the ground conductor circuits belong to the first category and that the signal conductor circuits belong to the second category, and the inputting of the shot numbers for forming the openings includes setting the shot number for forming the openings reaching the conductor circuits belonging to the first category is smaller than the shot number for forming the openings reaching the conductor circuits belonging to the second category.

According to another aspect of the present invention, a processing system for manufacturing a printed wiring board includes a table that holds an intermediate substrate including an insulating layer, a conductor layer including conductor circuits formed on the insulating layer, and a first resin insulating layer formed on the insulating layer and the conductor layer, a laser processing machine including a laser oscillator that oscillates laser for forming openings for via conductors that penetrates through the first resin insulating layer and reaches the conductor layer, a polarization device that changes a direction of the laser irradiated from the laser processing machine, and a control device including circuitry that holds processing data for forming the openings. The processing data includes positions at which the openings is to be formed and shot numbers for forming the openings, the shot numbers are determined based on information on the conductor circuits under the positions, the conductor circuits include power supply conductor circuits, ground conductor circuits, and signal conductor circuits, and the information includes classification including a first category and a second category such that the power supply conductor circuits and the ground conductor circuits belong to the first category and that the signal conductor circuits belong to the second category, and the shot numbers are set such that a shot number for forming the openings reaching the conductor circuits belonging to the first category is smaller than a shot number for forming the openings reaching the conductor circuits belonging to the second category.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
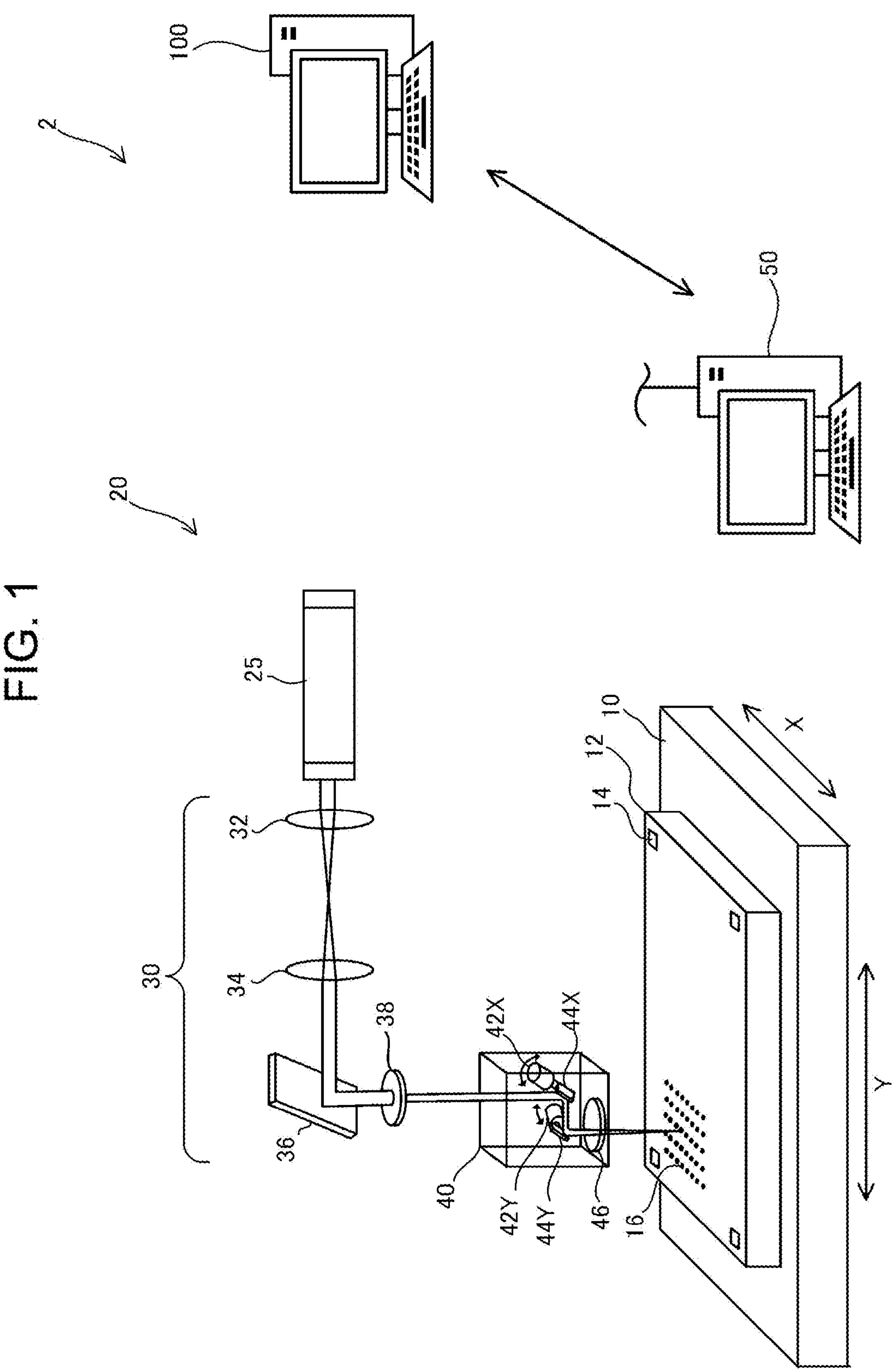
FIG. 1 is an explanatory diagram schematically illustrating a processing system according to an embodiment of the present invention.

Embodiments will now be described with reference to the accompanying drawings, wherein like reference numerals designate corresponding or identical elements throughout the various drawings.

Embodiment

FIG. 1 is an explanatory diagram schematically illustrating a processing system 2 according to an embodiment of the present invention. The processing system 2 illustrated in FIG. 1 is a system for forming openings 16 for via conductors in an intermediate substrate 12. The processing system 2 includes a table 10, a laser processing machine 20, a control device 50 and a terminal device 100.

The table 10 holds the intermediate substrates 12. The intermediate substrate 12 is placed on the table 10. In FIG. 1 the intermediate substrate 12 is schematically drawn. The intermediate substrate 12 includes: an insulating layer; a first conductor layer including multiple conductor circuits formed on the insulating layer; and a first resin insulating layer formed on the insulating layer and the first conductor layer. The intermediate substrate 12 has alignment marks 14 for positioning. The table 10 moves the intermediate substrate 12 in X-Y directions.

The laser processing machine 20 includes a laser oscillator 25, an optical system 30, and a galvano head 40. The laser oscillator 25 is a laser source. The laser oscillator 25 oscillates $CO_2$ laser.

Laser reaches the galvano head 40 via the optical system 30. The optical system 30 includes a condenser lens 32, a collimating lens 34, a mirror 36, and a mask 38.

The galvano head 40 controls a laser irradiation position. The galvano head 40 includes galvano mirrors (44X, 44Y), motors (42X, 42Y), and an f-θ lens 46. The galvano mirror (44X) controls a position in the X direction. The galvano mirror (44Y) controls a position in the Y direction. The motors (42X, 42Y) drive the galvano mirrors (44X, 44Y). The motors (42X, 42Y) adjust angles of the galvano mirrors (44X, 44Y) according to an instruction from the control device 50. The f-θ lens 46 focuses laser to a target position. Laser is irradiated to the first resin insulating layer of the intermediate substrate 12 via the galvano head 40. Laser penetrates the first resin insulating layer and reaches the first conductor layer. The openings 16 for via conductors penetrating the first resin insulating layer are formed. Laser is irradiated once or multiple times in order to form each one of the openings 16. The number of times of laser irradiation is referred to as a shot number.

Figure 2:
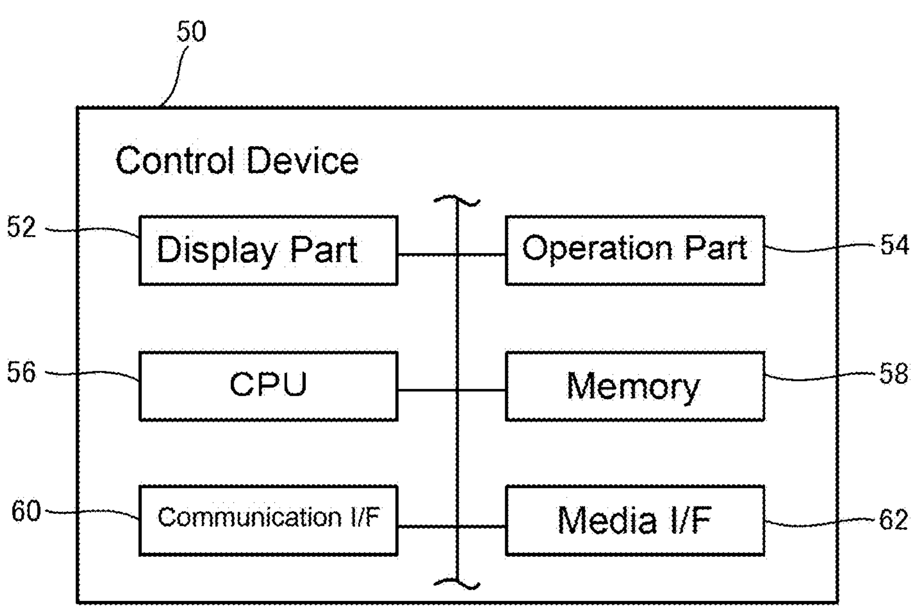
FIG. 2 is a block diagram illustrating a control device according to an embodiment of the present invention.

The control device 50 controls operations of the table 10, the laser oscillator 25, and the galvano head 40. As illustrated in FIG. 2, the control device 50 includes a display part 52, an operation part 54, a CPU 56, a memory 58, a communication I/F (interface) 60, and a media I/F 62. The operation part 54 includes a mouse and a keyboard. A user (for example, an operator of the laser processing machine 20) can input various instructions by operating the operation part 54.

The CPU 56 executes various processes according to a program stored in the memory 58. Further, the memory 58 stores processing data. The processing data includes the positions of the openings 16 and the laser shot number for each of the openings 16. The CPU 56 commands the formation of the openings 16 according to the processing data.

The communication I/F 60 is connected to a communication network. The CPU 56 can communicate with an external terminal (the terminal device 100 or the like) via the communication I/F 60 and the communication network. The media I/F 62 reads or writes from or to a recording medium.

Figure 3:
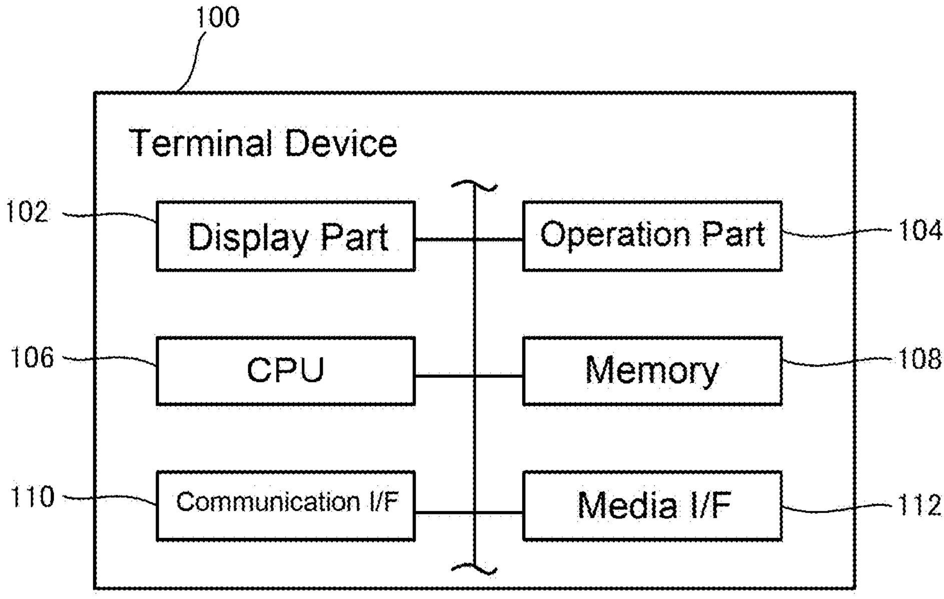
FIG. 3 is a block diagram illustrating a terminal device according to an embodiment of the present invention.

The terminal device 100 is provided separately from the control device 50. An example of the terminal device 100 is a computer. As illustrated in FIG. 3, the terminal device 100 includes a display part 102, an operation part 104, a CPU 106, a memory 108, a communication I/F 110, and a media I/F 112. The operation part 104 includes a mouse and a keyboard. A user (for example, a designer of a printed wiring board) can input various instructions to the terminal device 100 by operating the operation part 104.

The CPU 106 executes various processes according to a program stored in the memory 108. The CPU 106 can determine the shot numbers. The memory 108 stores design data of a printed wiring board. The communication I/F 110 is connected to the communication network. The CPU 106 can communicate with the control device 50 via the communication I/F 110 and the communication network. The media I/F 112 reads or writes from or to a recording medium.

Figure 4:
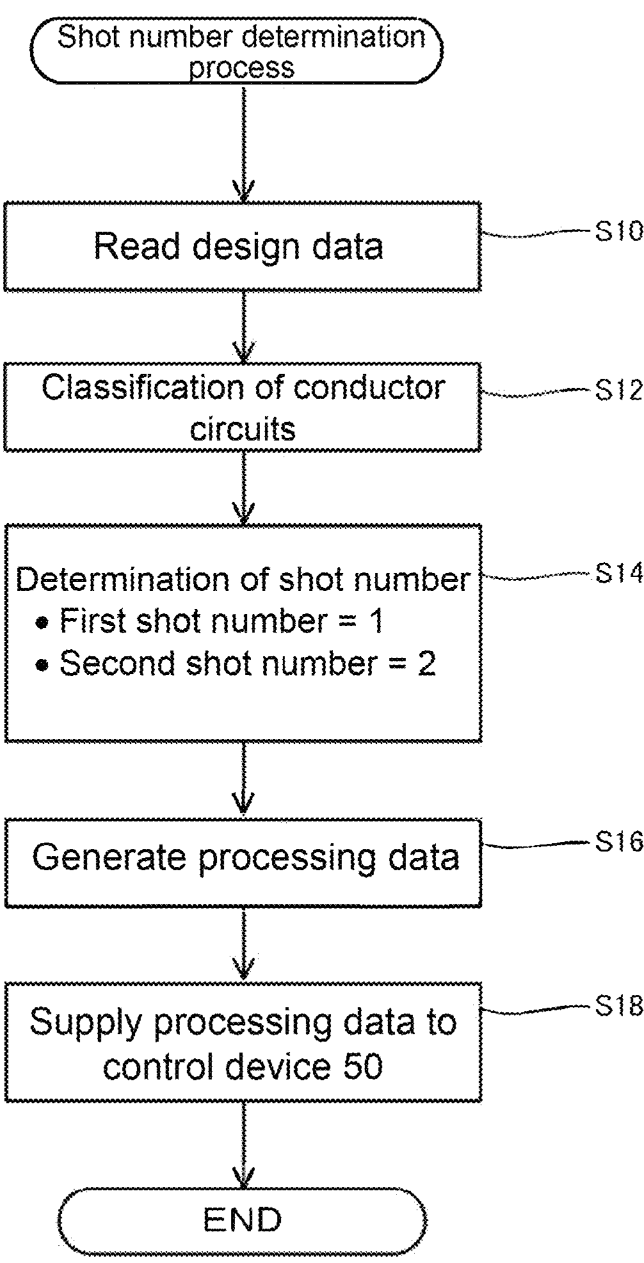
FIG. 4 is a flowchart for describing a shot number determination process according to an embodiment of the present invention.

In the processing system 2 of the embodiment, the terminal device 100 generates processing data for forming the openings 16 for via conductors based on the design data of the printed wiring board (see FIG. 4). The processing data includes the positions of the openings 16 and the shot numbers for forming the openings 16. The terminal device 100 supplies the processing data to the control device 50. The control device 50 controls the table 10, the laser oscillator 25, and galvano head 40 based on the processed data.

Shot Number Determination Process

FIG. 4 is a flowchart illustrating a shot number determination process executed by the CPU 106 of the terminal device 100. The shot number determination process generates the processing data based on the design data. When the user of the terminal device 100 inputs a predetermined start operation to the operation part 104, the CPU 106 starts the processing of FIG. 4.

Figure 5:
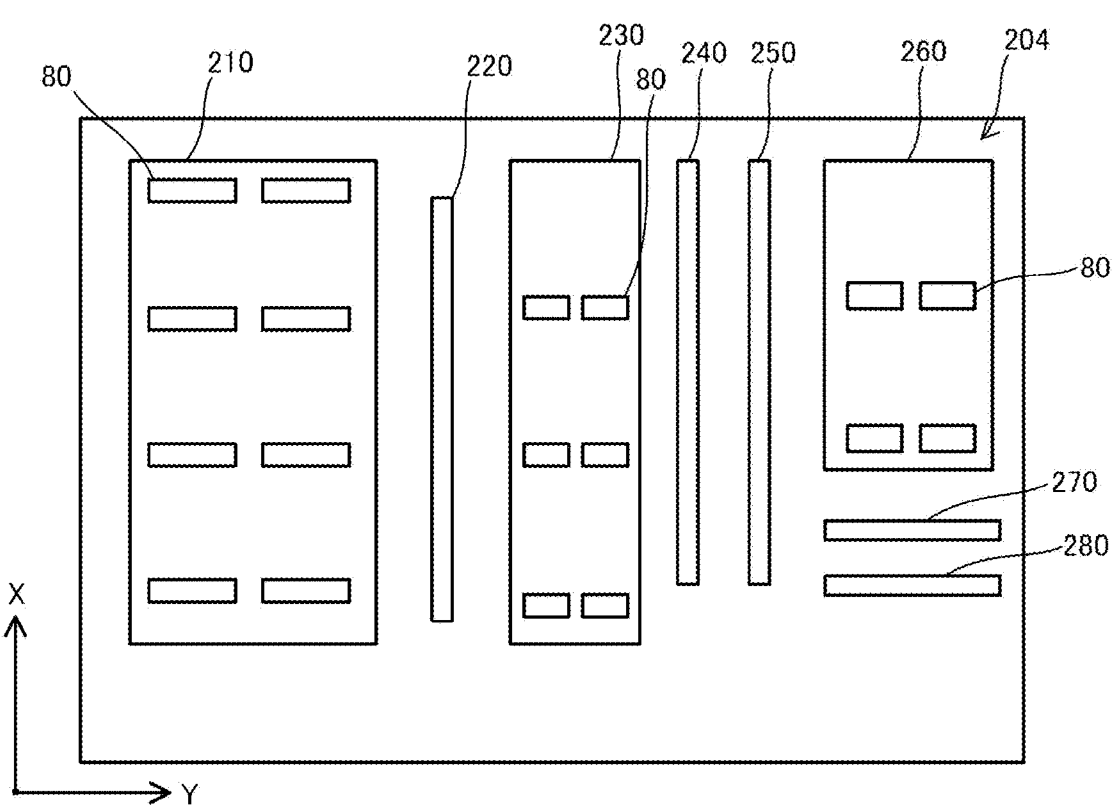
FIG. 5 is a layout of a first conductor layer according to an embodiment of the present invention.

In S10, the CPU 106 reads the design data stored in the memory 108. A layout of a conductor layer is read from the design data. The printed wiring board includes multiple conductor layers. Therefore, the design data includes layout data for each conductor layer. FIG. 5 schematically illustrates a layout of a first conductor layer 204 including multiple conductor circuits (210, 220, 230, 240, 250, 260, 270, 280). FIG. 5 illustrates the layout of the first conductor layer 204 among the multiple conductor layers included in the design data.

As illustrated in FIG. 5, the layout of the first conductor layer 204 is preferably drawn on an X-Y plane. The X-Y plane includes X and Y axes. The layout contains information about presence or absence of a conductor on coordinates. The multiple conductor circuits 210 and the like in the first conductor layer 204 are associated with coordinates. Each of the conductor circuits 210 has position information. The position information can also be referred to as a position.

In S12 of FIG. 4, the CPU 106 classifies conductor circuits included in one conductor layer. The first conductor layer 204 includes power supply conductor circuits, ground conductor circuits, and signal conductor circuits. The conductive circuits are stratified into a first category and a second category. The power supply conductor circuits and the ground conductor circuits belong to the first category. The signal conductor circuits belong to the second category. The conductor circuits belonging to the first category may be classified into power supply conductor circuits and ground conductor circuits. Since each conductor circuit has position information, the coordinates and the category of the conductor circuit are related.

The classification in S12 may be performed using various methods. Examples of the classification methods are described below.

First Example

In a first example, the CPU 106 analyzes the layout of the first conductor layer 204 (see FIG. 5). Classification is performed based on results of the analysis. For example, the CPU 106 analyzes widths of the conductor circuits. Then, the conductor circuits are classified according to the widths. A conductor circuit having a width equal to or greater than a reference value is classified into the first category. In the example of FIG. 5, the conductor circuits (210, 230, 260) belong to the first category. A conductor circuit having a width less than the reference value is classified into the second category. In the example of FIG. 5, the conductor circuits (220, 240, 250, 270, 280) belong to the second category. The signal conductor circuits belong to the second category.

Second Example

Figure 6A:
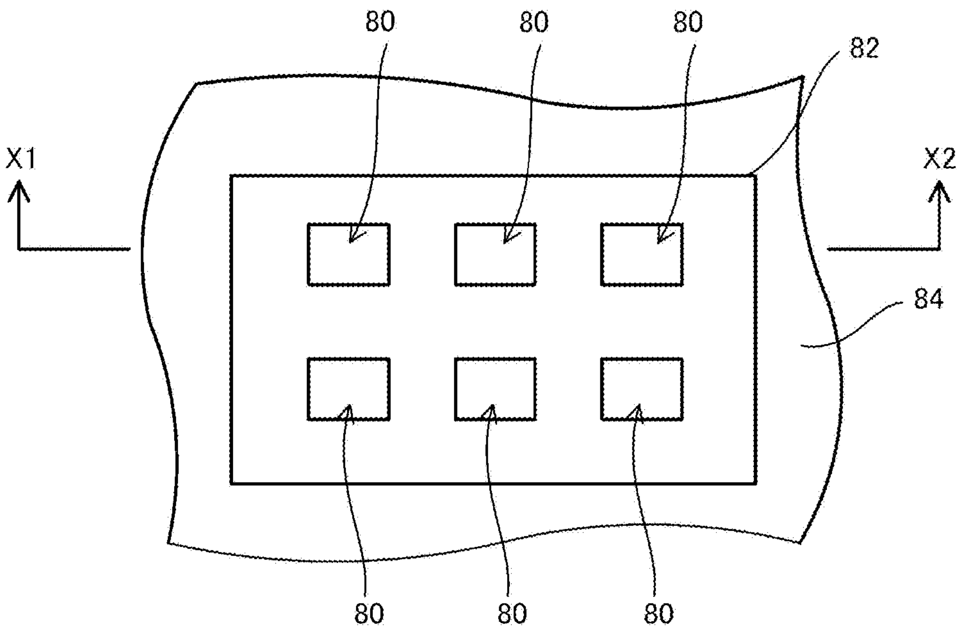
FIG. 6A is a top view of one conductor circuit according to an embodiment of the present invention.
Figure 6B:
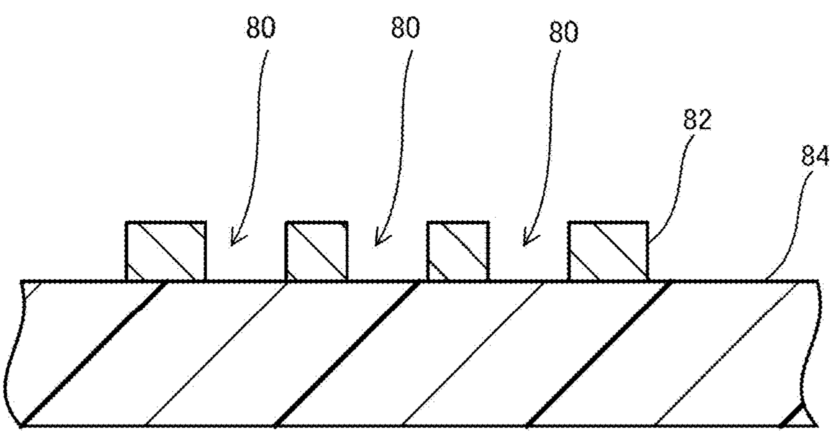
FIG. 6B is a cross-sectional view between X1 and X2 in FIG. 6A.

In a second example, the CPU 106 classifies the conductor circuits based on shapes of the conductor circuits. For example, the CPU 106 analyzes whether or not a conductor circuit has openings 80 illustrated in FIGS. 6A and 6B. FIG. 6A is a top view of one conductor circuit 82. FIG. 6B is a cross-sectional view between X1 and X2 in FIG. 6A. The conductor circuit 82 illustrated in FIGS. 6A and 6B is formed on an insulating layer 84. As illustrated in FIGS. 6A and 6B, the openings 80 formed in the conductor circuit 82 expose the insulating layer 84. The conductor circuit 82 having the openings 80 exposing the insulating layer 84 is classified into the first category. A conductor circuit that does not have openings 80 exposing the insulating layer is classified into the second category. In the example of FIG. 5 the conductor circuits (210, 230, 260) have openings 80. The conductor circuits (210, 230, 260) are classified into the first category. The conductor circuits (220, 240, 250, 270, 280) do not have openings 80. The conductor circuits (220, 240, 250, 270, 280) are classified into the second category.

Third Example

In a third example, the CPU 106 classifies each conductor circuit based on the number of the openings 16 reaching the conductor circuit. For example, when multiple openings 16 reach one conductor circuit, the CPU 106 classifies the conductor circuit into the first category. When one opening 16 reaches one conductor circuit, the CPU 106 classifies the conductor circuit into the second category. Multiple openings 16 reach each of the conductor circuits (210, 230, 260). Therefore, the conductor circuits (210, 230, 260) are classified into the first category. One opening 16 reaches each of the conductor circuits (220, 240, 250, 270, 280). Therefore, the conductor circuits (220, 240, 250, 270, 280) are classified into the second category.

Fourth Example

In a fourth example, the CPU 106 classifies each conductor circuit according to a connection destination of the conductor circuit. An example of a connection destination is a logic IC. For example, when a connection destination of a conductor circuit is connected to a signal in a logic IC, the CPU 106 classifies the conductor circuit into the second category. When a connection destination of a conductor circuit is a power supply in a logic IC, the CPU 106 classifies the conductor circuit as a power supply conductor circuit. A conductor circuit connected to a power supply in a logic IC is classified into the first category. When a connection destination of a conductor circuit is the ground in a logic IC, the CPU 106 classifies the conductor circuit as a ground conductor circuit. A conductor circuit connected to the ground in a logic IC is classified into the first category.

Fifth Example

In a fifth example, the CPU 106 classifies each conductor circuit based on a position of an opening 16 reaching the conductor circuit. For example, when an opening 16 reaches an end part of a conductor circuit, the CPU 106 classifies the conductor circuit into the second category. When an opening 16 reaches a central part of a conductor circuit, the CPU 106 classifies the conductor circuit into the first category.

In S12, to classify the conductor circuits, any combination of two or more of the methods of the first-fifth examples can be used.

In S14, the CPU 106 determines the laser shot numbers for forming the openings 16 according to the results of the classification in S12. The CPU 106 determines the shot number (first shot number) for forming each of the openings 16 reaching the conductor circuits belonging to the first category and the shot number (second shot number) for forming each of the openings 16 reaching the conductor circuits belonging to the second category. For example, the first shot number is 1 and the second shot number is 2. The first shot number is less than the second shot number. The difference between the second shot number and the first shot number is 1 or 2. 1 is preferable.

Figure 7:
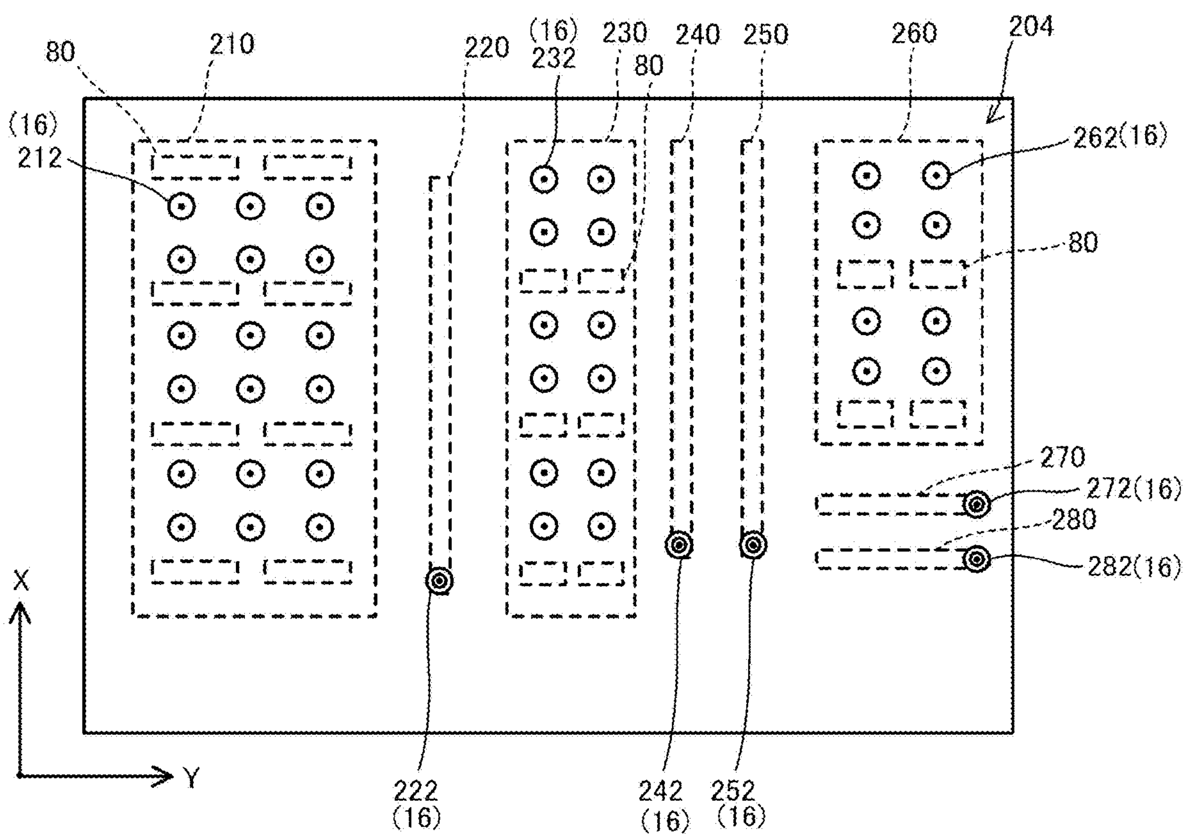
FIG. 7 is a layout of openings according to an embodiment of the present invention.

In S16, the CPU 106 generates the processing data. The processing data includes the positions of the openings included in the design data, the shot number for each of the openings, and the categories of the conductor circuits. In the processing data, the position, the shot number, and the category of a conductor circuit are related. FIG. 7 schematically illustrates a layout of the openings 16 in the processing data. The layout of the openings 16 includes the positions of the openings 16. The positions of the openings 16 are represented by centers of the openings 16. In FIG. 7 the centers are drawn as points. Or, the positions of the openings 16 are represented by centroids of the openings 16. In FIG. 7 the centroids are drawn as points.

As illustrated in FIG. 7, the layout of the openings 16 is preferably drawn on the X-Y plane. The X-Y plane includes the X and Y axes. The center and the coordinates of each of the openings 16 are related. The centroid and the coordinates of each of the openings 16 are related. Each of the openings 16 has position information. The position information can also be referred to as a position. The X and Y axes in FIGS.

5 and 7 are preferably common. Or, when the X-Y plane illustrated in FIG. 7 is projected onto the X-Y plane illustrated in FIG. 5 with light perpendicular to the X-Y plane illustrated in FIG. 5, the X-axis in FIG. 5 and the X-axis in FIG. 7 overlap. The Y-axis in FIG. 5 and the Y-axis in FIG. 7 overlap. Therefore, a position in the layout of the first conductor layer 204 and a position in the layout of the openings 16 are related. When the openings 16 are specified, the conductor circuits positioned at destinations of the specified openings 16 can be seen. The conductor circuits exposed by the specified openings 16 can be seen. The openings 16 and the categories of the conductor circuits are related. The positions of the openings 16 and the categories of the conductor circuits are related.

In FIG. 7, contours of the conductor circuits in the first conductor layer 204 are drawn with dotted lines so that a relationship between positions of the first conductor layer 204 and the positions of the openings 16 can be seen. Multiple single circles and multiple double circles are drawn in FIG. 7. The single circles and the double circles indicate the openings 16. The shot number for forming openings (212, 232, 262) indicated by the single circles is one. Each of the openings indicated by the single circles is formed with one shot. The shot number for forming openings (222, 242, 252, 272, 282) indicated by the double circles is two. Each of the openings indicated by the double circles is formed with two shots. In the following, the openings indicated by the single circles can be referred to as "one-shot openings." The openings indicated by the double circles can be referred to as "two-shot openings." The layout of the openings 16 can further include diameters of the openings 16.

In S18 of FIG. 4, the CPU 106 supplies the processing data to the control device 50. Specifically, the CPU 106 supplies the processing data to the control device 50 via the communication I/F 110 and the communication network. When S18 is completed, the CPU 106 terminates the processing of FIG. 4.

Opening Formation Process

Figure 8:
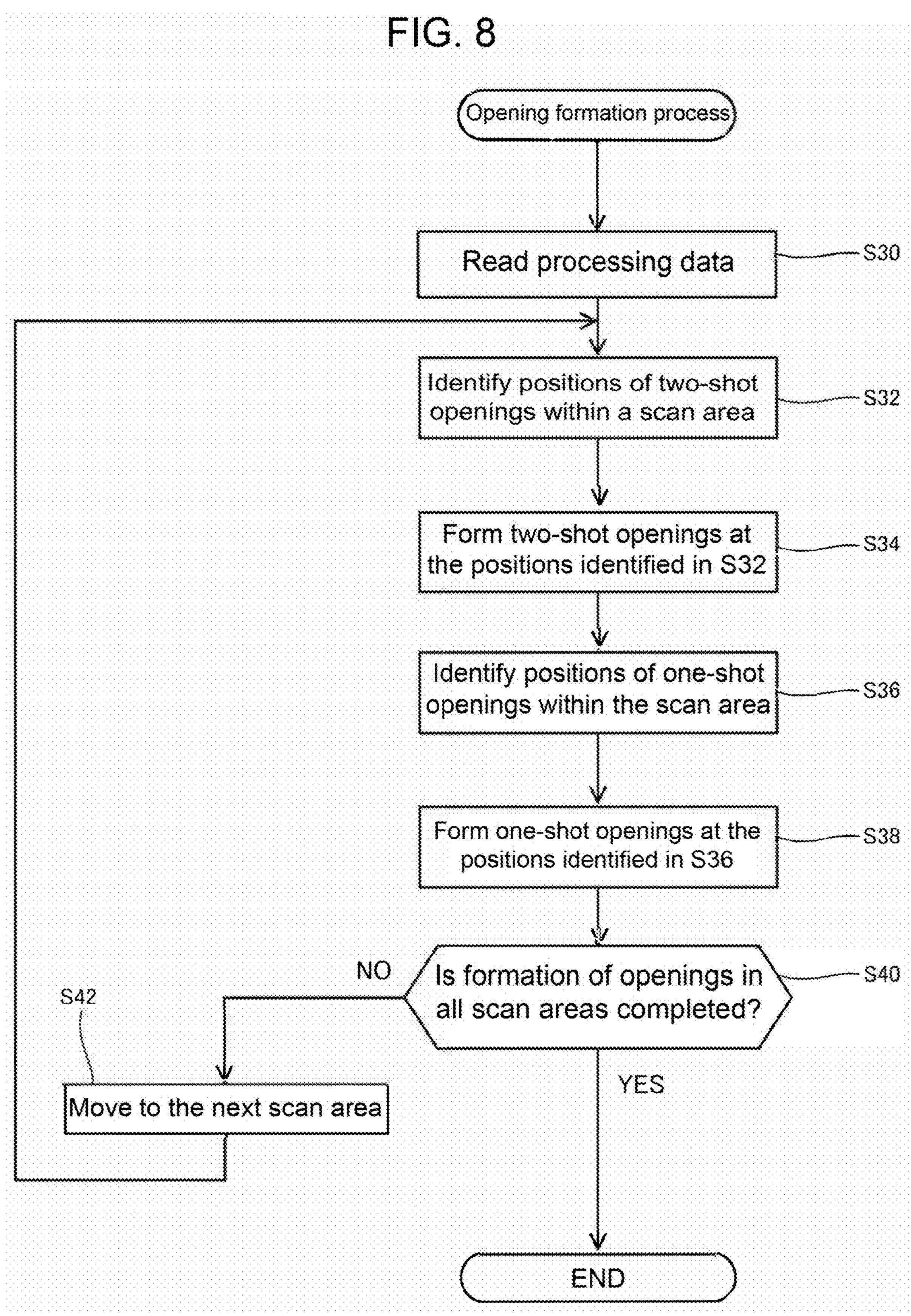
FIG. 8 is a flowchart for describing an opening formation process according to an embodiment of the present invention.

FIG. 8 is a flowchart illustrating an opening formation process executed by the CPU 56 of the control device 50. The opening formation process is performed according to the processing data. The opening formation process forms the openings 16 in the intermediate substrate 12 (FIG. 1). When the opening formation process of FIG. 8 is performed, the processing data (see S16 and S18 in FIG. 4) is stored in the memory 58 of the control device 50. When the user of the control device 50 inputs a predetermined start operation to the operation part 54, the CPU 56 starts the processing of FIG. 8.

In S30, the CPU 56 reads the processing data in the memory 58. In S32, the CPU 56 identifies all positions of two-shot openings within a current scan area in the processed data. That is, the CPU 56 identifies formation positions of the openings reaching the conductor circuits belonging to the second category.

In S34, the CPU 56 forms the openings at the positions identified in S32. Specifically, the CPU 56 forms all two-shot openings within the scan area by controlling the table 10, the laser oscillator 25, and the galvano head 40. Each of the openings is formed with two shots. The two-shot openings are formed in a burst mode. When all the two-shot openings within the scan area are formed, the processing of S34 ends. The burst mode is described in Japanese Patent Application Laid-Open Publication No. 2002-144060.

In S36, the CPU 56 identifies all positions of one-shot openings within a scan area in the processed data. In S36, the CPU 56 identifies formation positions of the openings reaching the conductor circuits belonging to the first category.

In S38, the CPU 56 forms the openings at the positions identified in S36. Specifically, the CPU 56 forms all one-shot openings within the scan area by controlling the table 10, the laser oscillator 25, and the galvano head 40. In this case, each of the openings is formed with one shot. When all the one-shot openings within the scan area are formed, the processing of S38 ends.

In S40, the CPU 56 determines whether or not the openings in all scan areas have been formed. When the openings in all the scan areas have not been formed, the CPU 56 determines NO in S40 and proceeds to S42. In S42, the CPU 56 moves to the next scan area by controlling the table 10. The CPU 56 performs the processing of S32-S38 again. As a result, one-shot openings and two-shot openings are formed in the next scan area.

When formation of one-shot openings and two-shot openings in all scan areas is completed, the CPU 56 determines YES in S40. The CPU 56 terminates the processing of FIG. 8.

Another example of forming the openings is described below. All positions at which openings in a scan area are formed are irradiated with one shot in a cycle mode. As a result, all one-shot openings within the scan area are formed. Subsequently, positions at which two-shot openings are formed are irradiated with one shot in the cycle mode. As a result, all two-shot openings within the scan area are formed. The cycle mode is described in Japanese Patent Application Laid-Open Publication No. 2002-144060.

As described above, in the embodiment, the shot number differs depending on information about conductor circuits under opening positions. The information includes the first category and the second category. Comparing the embodiment with a method in which all openings are formed with two shots, the embodiment shortens a processing time required for forming the openings.

Manufacturing Process of Printed Wiring Board

FIGS. 9A-9F illustrate a manufacturing process of a printed wiring board using the processing system 2 according to the embodiment. FIGS. 9A-9F are cross-sectional views.

Figure 9A:
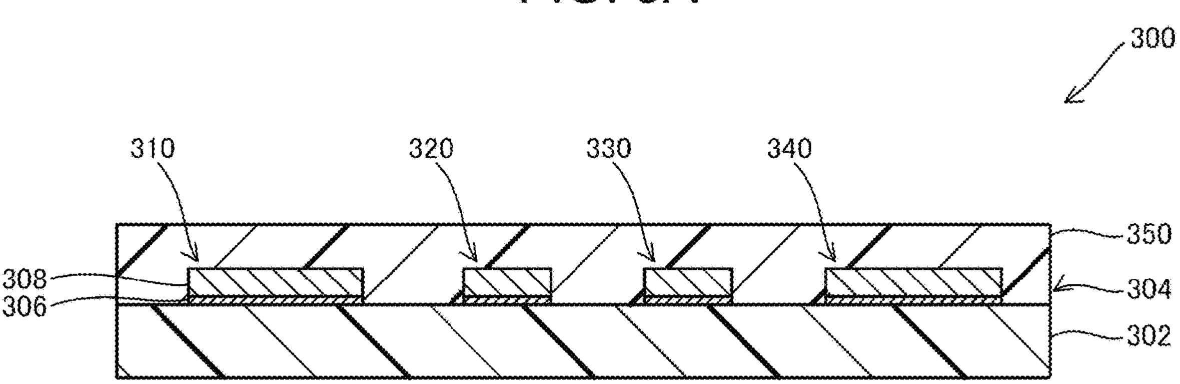
FIG. 9A is a cross-sectional view schematically illustrating a method for manufacturing a printed wiring board according to an embodiment of the present invention.

As illustrated in FIG. 9A, an intermediate substrate 300 is prepared. The intermediate substrate 300 includes: an insulating layer 302; a first conductor layer 304 including multiple conductor circuits (310, 320, 330, 340) formed on the insulating layer 302; and a first resin insulating layer 350 formed on the insulating layer 302 and the first conductor layer 304. The conductor circuit 310 is a power supply conductor circuit. The conductor circuits (320, 330) are signal conductor circuits. The conductor circuit 340 is a ground conductor circuit 340. The conductor circuits (310, 320, 330, 340) forming the first conductor layer 304 are formed of a seed layer 306 formed on the insulating layer 302 and an electrolytic plating film 308 formed on the seed layer 306.

Figure 9B:
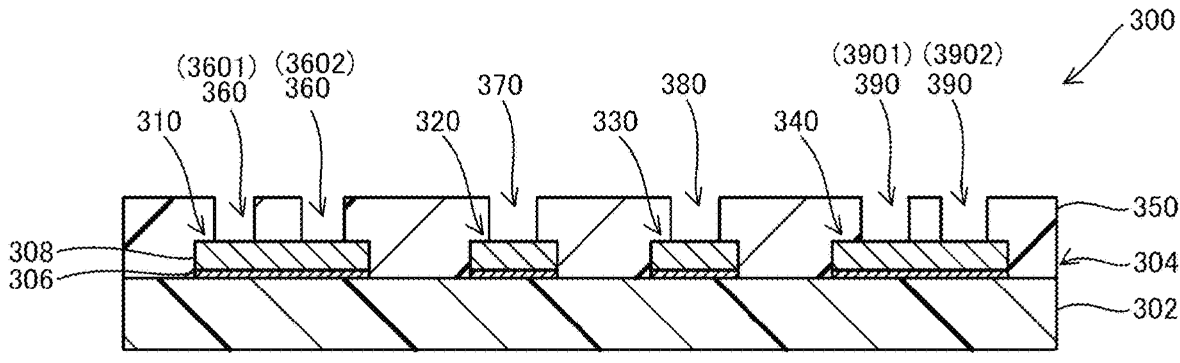
FIG. 9B is a cross-sectional view schematically illustrating a method for manufacturing a printed wiring board according to an embodiment of the present invention.

As illustrated in FIG. 9B, openings (360, 370, 380, 390) for via conductors that penetrate the first resin insulating layer 350 and reach the first conductor layer 304 are formed. Multiple openings 360 are formed on one power supply conductor circuit 310. One opening (370, 380) is formed on one signal conductor circuit (320, 330). Multiple openings 390 are formed on one ground conductor circuit 340. The openings (360, 370, 380, 390) are formed according to the opening formation process (FIG. 8).

Figure 9C:
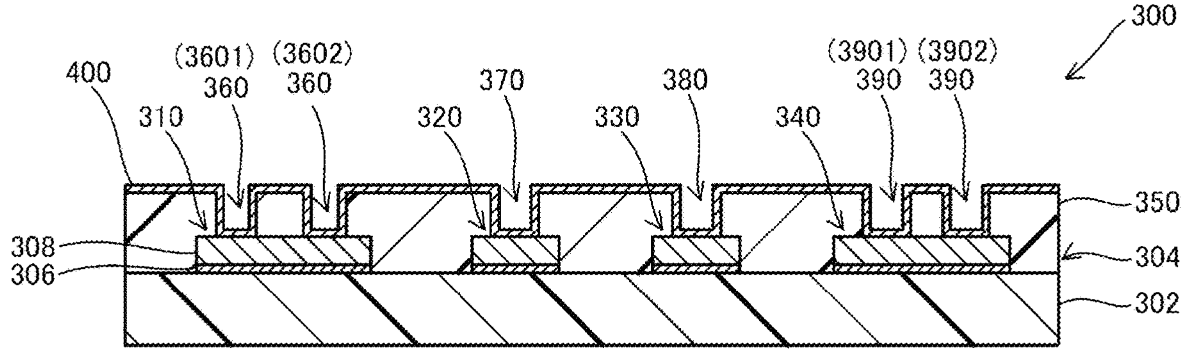
FIG. 9C is a cross-sectional view schematically illustrating a method for manufacturing a printed wiring board according to an embodiment of the present invention.

As illustrated in FIG. 9C, a seed layer 400 is formed on the first resin insulating layer 350. The seed layer 400 is formed on inner wall surfaces of the openings (360, 370, 380, 390) and on the conductor circuits (310, 320, 330, 340) exposed from the openings (360, 370, 380, 390).

Figure 9D:
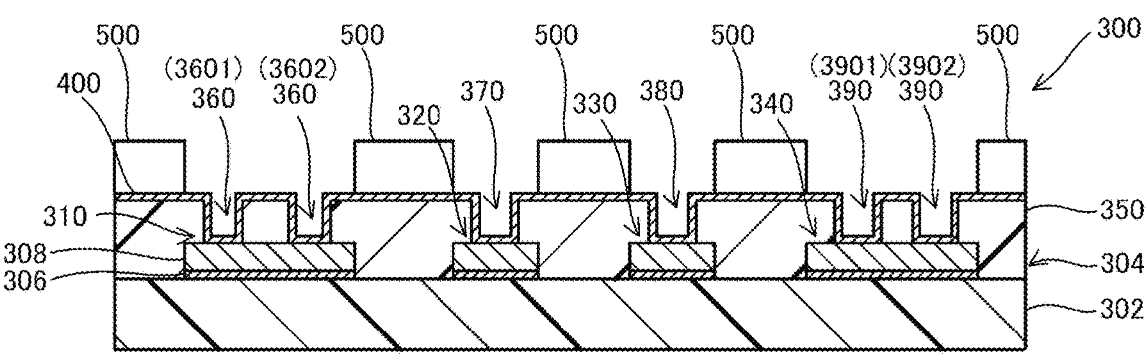
FIG. 9D is a cross-sectional view schematically illustrating a method for manufacturing a printed wiring board according to an embodiment of the present invention.

As illustrated in FIG. 9D, a plating resist 500 is formed on the seed layer 400.

Figure 9E:
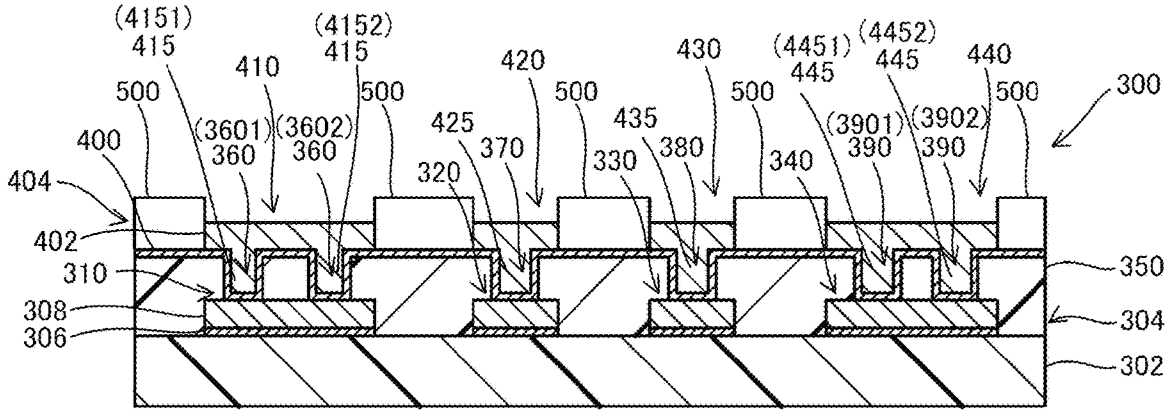
FIG. 9E is a cross-sectional view schematically illustrating a method for manufacturing a printed wiring board according to an embodiment of the present invention.

As illustrated in FIG. 9E, an electrolytic plating film 402 is formed on the seed layer 400 exposed from the plating resist 500. The electrolytic plating film 402 fills the openings (360, 370, 380, 390). As a result, via conductors (415, 425, 435, 445) are formed.

Figure 9F:
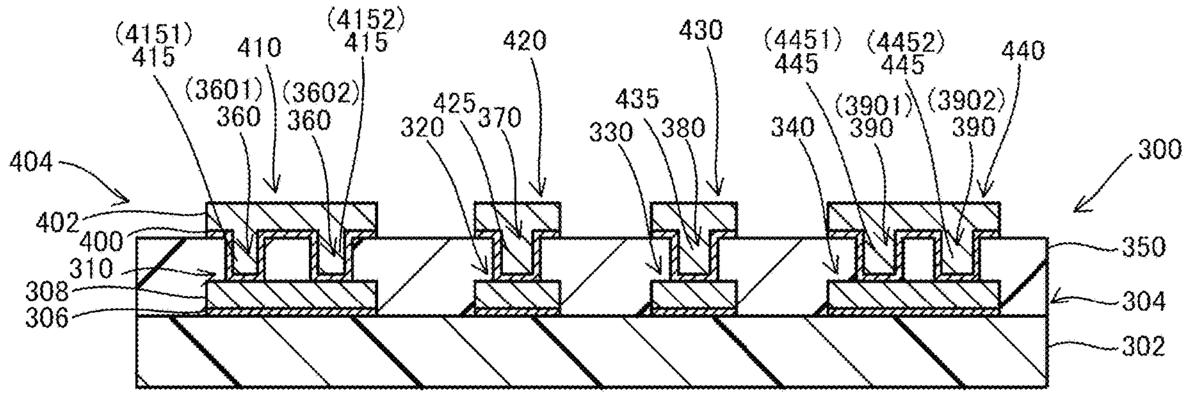
FIG. 9F is a cross-sectional view schematically illustrating a method for manufacturing a printed wiring board according to an embodiment of the present invention.

The plating resist 500 is removed. As illustrated in FIG. 9F, the seed layer 400 exposed from conductor circuits (410, 420, 430, 440) is removed. A second conductor layer 404 is formed on the first resin insulating layer 350. A multilayer printed wiring board is formed. The second conductor layer 404 includes the power supply conductor circuit 410, the ground conductor circuit 440, and the signal conductor circuits (420, 430). One power supply conductor circuit 310 in the first conductor layer 304 and one power supply conductor circuit 410 in the second conductor layer 404 are connected via multiple via conductors 415. One power supply conductor circuit 310 in the first conductor layer 304 and one power supply conductor circuit 410 in the second conductor layer 404 are connected in parallel via multiple via conductors 415.

One ground conductor circuit 340 in the first conductor layer 304 and one ground conductor circuit 440 in the second conductor layer 404 are connected via multiple via conductors 445. One ground conductor circuit 340 in the first conductor layer 304 and one ground conductor circuit 440 in the second conductor layer 404 are connected in parallel via multiple via conductors 445.

In the conductor circuits belonging to the first category, multiple via conductors are connected to one conductor circuit. For example, even when one of multiple via conductors reaching one of the conductor circuits belonging to the first category is disconnected, conduction is ensured via the other via conductors. Therefore, the openings 16 reaching the conductor circuits belonging to the first category can be formed with the first shot number.

One signal conductor circuit 320 (330) in the first conductor layer 304 and one signal conductor circuit 420 (430) in the second conductor layer 404 are connected via one via conductor 425 (435). One signal conductor circuit 320 (330) in the first conductor layer 304 and one signal conductor circuit 420 (430) in the second conductor layer 404 are connected in series via one via conductor 425 (435). Only one opening 16 reaches each signal conductor circuit (see FIG. 7). By forming the openings reaching the signal conductor circuits with the second shot number, resin residues in the openings 16 can be reduced. Connection reliability of the signal conductor circuits is ensured.

An opening 3601 reaching the power supply conductor circuit 310 and an opening 3901 reaching the ground conductor circuit 340 are examples of a "first opening" (FIGS. 9B-9F). An opening 3602 reaching the power supply conductor circuit 310 and an opening 3902 reaching the ground conductor circuit 340 are examples of a "second opening" (FIGS. 9B-9F). A via conductor 4151 connected to the power supply conductor circuit 310 and a via conductor 4451 connected to the ground conductor circuit 340 are examples of a "first via conductor." A via conductor 4152 connected to the power supply conductor circuit 310 and a via conductor 4452 connected to the ground conductor circuit 340 are examples of a "second via conductor" (FIGS. 9E and 9F). The optical system 30 and the galvano head 40 (FIG. 1) are an example of a "polarization part." The control device 50 is an example of a "control part."

First Modified Embodiment

In a first modified embodiment, the CPU 56 of the control device 50 performs the shot number determination process (FIG. 4) and the opening formation process (FIG. 8). As a result, the terminal device 100 is not required.

Second Modified Embodiment

In a second modified embodiment, the first shot number is determined to be "2" and the second shot number is determined to be "3" in the shot number determination process (FIG. 4). A difference between the first shot number and the second shot number is 1.

Another Embodiment of Second Modified Embodiment

In another embodiment of the second modified embodiment, the first shot number is determined to be "1" and the second shot number is determined to be "3" in the shot number determination process (FIG. 4). A difference between the first shot number and the second shot number is 2.

Third Modified Embodiment

In the embodiment, the processing data including the positions and the shot numbers is provided to the control device 50. In contrast, in a third modified embodiment, data including the positions for forming the openings and data including the shot numbers for forming the openings are separately provided to the control device 50.

Fourth Modified Embodiment

In a fourth modified embodiment, the layout data of each conductor layer included in the design data includes information indicating the categories of the conductor circuits (power supply conductor circuit, ground conductor circuit, and signal conductor circuits). The information indicating the categories of the conductor circuits is associated with the position information of the conductor circuits when the design data is created. The conductor circuits and the information indicating the categories of the conductor circuits may be associated by a designer who creates the design data. When the designer classifies the conductor circuits, the classification by the designer is included in classification according to the embodiment of the present invention. The classification of the conductor circuits by the designer is included in the classification of the embodiment. In the fourth modified embodiment, in S10 of FIG. 4, the CPU 106 reads the design data stored in the memory 108. A layout of a conductor layer is read from the design data. In S12, the CPU 106 reads the information indicating the categories of the conductor circuits included in the layout. The CPU 106 determines the categories of the conductor circuits based on the read information. As a result, the conductor circuits are classified by the CPU 106. The processing of S12 in the fourth modified embodiment is an example of "classifying."

The technology of International Publication No. 98/22252 attempts to improve productivity by using multiple galvano heads. However, it is thought that increasing the productivity by only using multiple galvano heads leads to a higher price of the laser processing device.

A method for manufacturing a printed wiring board according to an embodiment of the present invention includes: preparing an intermediate substrate that includes: an insulating layer; a first conductor layer including multiple conductor circuits formed on the insulating layer; and a first resin insulating layer formed on the insulating layer and the first conductor layer; preparing a laser processing machine for forming openings for via conductors that penetrate the first resin insulating layer and reach the first conductor layer; providing positions at which the openings are formed to the laser processing machine; classifying the conductor circuits under the positions; providing shot numbers for forming the openings based on the classification to the laser processing machine; and forming the openings based on the positions and the shot numbers. The multiple conductor circuits include power supply conductor circuits, ground conductor circuits, and signal conductor circuits. The classifying includes stratifying the conductor circuits into a first category and a second category. The power supply conductor circuits and the ground conductor circuits belong to the first category. The signal conductor circuits belong to the second category. The shot number for forming the openings reaching the conductor circuits belonging to the first category is smaller than the shot number for forming the openings reaching the conductor circuits belonging to the second category.

When multiple openings are formed in one resin insulating layer, for example, all the openings are formed with the same shot number. For example, the shot number is determined from a point of view of reliability. Since the signal conductor circuits transmit data, quality of the openings reaching the signal conductor circuits is important. Therefore, all the openings in the one resin insulating layer are formed with the shot number (signal shot number) for forming the openings reaching the signal conductor circuits. In order to improve the reliability, the signal shot number is two or more. In contrast, a manufacturing method according to an embodiment of the present invention stratifies the conductor circuits into the first category and the second category. The shot number for forming the openings reaching the conductor circuits belonging to the first category is smaller than the shot number for forming the openings reaching the conductor circuits belonging to the second category. Not all the openings are formed with the shot number for forming the openings reaching the conductor circuits belonging to the second category. Therefore, a processing time required for forming the openings is shortened. Productivity of the printed wiring board is increased.

A processing system according to an embodiment of the present invention for manufacturing a printed wiring board includes: a table for holding an intermediate substrate that includes: an insulating layer; a first conductor layer including multiple conductor circuits formed on the insulating layer; and a first resin insulating layer formed on the insulating layer and the first conductor layer; a laser processing machine that includes: a laser oscillator that oscillates laser for forming openings for via conductors that penetrate the first resin insulating layer and reach the first conductor layer; and a polarization part that changes a direction of the laser; and a control part that holds processing data for forming the openings. The processing data includes positions at which the openings are formed and the shot numbers for forming the openings. The shot numbers are determined based on information about the conductor circuits under the positions. The multiple conductor circuits include power supply conductor circuits, ground conductor circuits, and signal conductor circuits. The information includes a first category and a second category. The power supply conductor circuits and the ground conductor circuits belong to the first category. The signal conductor circuits belong to the second category. The shot number for forming the openings reaching the conductor circuits belonging to the first category is smaller than the shot number for forming the openings reaching the conductor circuits belonging to the second category.

In a processing system according to an embodiment of the present invention, the laser processing machine forms the openings according to the positions and the shot numbers included in the processing data held by the control part. The shot numbers are determined according to the information about the conductor circuits under the positions. The shot number for forming the openings reaching the conductor circuits belonging to the first category is smaller than the shot number for forming the openings reaching the conductor circuits belonging to the second category. Therefore, a processing time required for forming the openings is shortened. Productivity of the printed wiring board is increased.

Obviously, numerous modifications and variations of the present invention are possible in light of the above teachings. It is therefore to be understood that within the scope of the appended claims, the invention may be practiced otherwise than as specifically described herein.

The invention claimed is:

1. A method for manufacturing a printed wiring board, comprising:

placing, on a table of a processing system comprising a laser processing machine and a control device, an intermediate substrate comprising an insulating layer, a conductor layer including a plurality of conductor circuits formed on the insulating layer, and a first resin insulating layer formed on the insulating layer and covering the conductor layer;

inputting, to the control device of the processing system, processing data including classification of the plurality of conductor circuits in the conductor laver under a plurality of positions at which the plurality of openings is to be formed in the intermediate substrate, and a plurality of shot numbers for forming the plurality of openings determined based on the classification of the plurality of conductor circuits in the conductor layer; and applying a laser upon the first resin insulating layer of the intermediate substrate using the laser processing machine of the processing system based on the processing data including the plurality of positions and the plurality of shot numbers such that the plurality of openings is formed in the intermediate substrate, wherein the plurality of conductor circuits in the conductor layer includes a plurality of power supply conductor circuits, a plurality of ground conductor circuits, and a plurality of signal conductor circuits, the classification includes stratifying the plurality of conductor circuits into a first category and a second category such that the plurality of power supply conductor circuits and the plurality of ground conductor circuits belong to the first category and that the plurality of signal conductor circuits belongs to the second category, and the inputting the processing data includes setting a shot number for forming the openings reaching the conductor circuits belonging to the first category smaller than a shot number for forming the openings reaching the conductor circuits belonging to the second category.

2. The method for manufacturing a printed wiring board according to claim 1, wherein the plurality of openings is formed such that all of the openings reaching the conductor circuits belonging to the first category are formed with a same shot number as one another and that all of the openings reaching the conductor circuits belonging to the second category are formed with a same shot number as one another.

3. The method for manufacturing a printed wiring board according to claim 1, wherein a number of the openings reaching each of the conductor circuits belonging to the first category is two or more, and a number of the openings reaching each of the conductor circuits belonging to the second category is one.

4. The method for manufacturing a printed wiring board according to claim 1, further comprising:
generating the processing data in a terminal device in the processing system based on design data.

5. The method for manufacturing a printed wiring board according to claim 4, wherein the shot number for forming the openings reaching the power supply conductor circuits is same as the shot number for forming the openings reaching the ground conductor circuits.

6. The method for manufacturing a printed wiring board according to claim 4, wherein a number of the openings reaching each of the plurality of power supply conductor circuits is two or more, and a number of the openings reaching each of the signal conductor circuits is one.

7. The method for manufacturing a printed wiring board according to claim 4, wherein a number of the openings reaching each of the ground conductor circuits is two or more, and a number of the openings reaching each of the signal conductor circuits is one.

8. The method for manufacturing a printed wiring board according to claim 1, further comprising:
forming a plurality of via conductors in the plurality of openings, respectively;
laminating a second conductor layer on the first resin insulating layer; and
laminating a second resin insulating layer on the first resin insulating layer such that the second resin insulating layer covers the second conductor layer.

9. The method for manufacturing a printed wiring board according to claim 8, wherein the plurality openings reaching each of the conductor circuits belonging to the first category includes a first opening and a second opening, and the plurality of via conductors includes a first via conductor formed in the first opening and a second via conductor formed in the second opening such that the first via conductor and the second via conductor are connected in parallel by the second conductor layer.

10. The method for manufacturing a printed wiring board according to claim 1, wherein a difference between the shot number for forming the openings reaching the conductor circuits belonging to the first category and the shot number for forming the openings reaching the conductor circuits belonging to the second category is 1 or 2.

11. The method for manufacturing a printed wiring board according to claim 10, wherein the shot number for forming the openings reaching the conductor circuits belonging to the first category is 1, and the shot number for forming the openings reaching the plurality of conductor circuits belonging to the second category is 2.

12. The method for manufacturing a printed wiring board according to claim 1, wherein the applying the laser includes forming all the openings reaching the conductor circuits belonging to the first category, and forming all the openings reaching the conductor circuits belonging to the second category.

13. The method for manufacturing a printed wiring board according to claim 4 wherein the design data includes at least one of a layout of the conductor layer, shapes of the conductor circuits, a number of the openings, connection destinations of the conductor circuits, and the positions of the openings.

14. The method for manufacturing a printed wiring board according to claim 2, wherein a number of the openings reaching each of the conductor circuits belonging to the first category is two or more, and a number of the openings reaching each of the conductor circuits belonging to the second category is one.

15. The method for manufacturing a printed wiring board according to claim 2, further comprising:
generating the processing data in a terminal device in the processing system based on a design data.

16. The method for manufacturing a printed wiring board according to claim 15, wherein the shot number for forming the openings reaching the power supply conductor circuits is same as the shot number for forming the openings reaching the ground conductor circuits.

17. The method for manufacturing a printed wiring board according to claim 15, wherein a number of the openings reaching each of the plurality of power supply conductor circuits is two or more, and a number of the openings reaching each of the signal conductor circuits is one.

* * * * *